United States Patent
Tanaka et al.

(10) Patent No.: US 6,514,888 B1
(45) Date of Patent: *Feb. 4, 2003

(54) CUSHIONING MATERIAL FOR FORMING PRESS

(75) Inventors: Atsuo Tanaka, Yawata (JP); Akira Yoshida, Kanuma (JP)

(73) Assignee: Yamauchi Corporation, Osaka (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 9 days.

(21) Appl. No.: 08/890,882

(22) Filed: Jul. 10, 1997

Related U.S. Application Data

(63) Continuation of application No. 08/531,625, filed on Sep. 21, 1995, now abandoned.

(30) Foreign Application Priority Data

Sep. 21, 1994 (JP) .............................. 6-226552

(51) Int. Cl.$^7$ ................................. B32B 5/32
(52) U.S. Cl. .............. 442/224; 442/225; 442/226; 442/270; 442/271; 442/275; 442/241; 442/242; 442/260; 442/283; 442/277; 442/278; 428/909
(58) Field of Search .............. 428/909; 442/224–226, 442/238, 270, 271, 275, 241–242, 260, 265, 268, 277, 278, 283, 381, 414

(56) References Cited

U.S. PATENT DOCUMENTS

| | | | |
|---|---|---|---|
| 4,184,589 A | | 1/1980 | Habegger |
| 4,461,800 A | | 7/1984 | Tanaka |
| 4,804,576 A | * | 2/1989 | Kuge et al. .................. 428/909 |
| 5,486,402 A | * | 1/1996 | Flint et al. .................. 428/909 |

FOREIGN PATENT DOCUMENTS

| | | | |
|---|---|---|---|
| CH | GB 1571266 | 7/1980 | |
| CN | 61647 | 6/1982 | |
| DE | 2627442 | 12/1977 | |
| DE | 3907453 | 9/1990 | |
| EP | 0 123230 | 10/1984 | |
| EP | 0447584 A1 | 3/1990 | |
| GB | 1571266 | 7/1980 | |
| JP | 47-46945 | 11/1972 | |
| WO | WO 91/11330 | * 8/1991 | ................. 428/909 |
| WO | 9 318913 | 9/1993 | |

OTHER PUBLICATIONS

Chinese Patent Office Action dated May 26, 2000; Fukami Patent Office Jul. 10, 2000 letter, page one only.

*Plastic Shashutsu Seikei Dokuhon*, pp. 333–335 published by Fukubunshokyoku in Jul. 1991.

Database WPI, Section Ch, Week 8224, Derwent Publications Ltd., London, GB; AN 82–48830E & JP–A–57 072 812 (Yamauchi Gum–Kogyo), May 7, 1982, Abstract.

* cited by examiner

*Primary Examiner*—Elizabeth M. Cole
(74) *Attorney, Agent, or Firm*—Birch, Stewart, Kolasch & Birch, LLP

(57) ABSTRACT

A cushioning material for forming press includes fiber material layers 31 and 32 superimposed with a bonding material layer 30 interposed, an upper rubber layer 33 positioned on an upper surface of one fiber material layer 31, a lower rubber layer 34 positioned on a lower surface of the other fiber material layer 32, an upper exudation preventing layer 35 positioned on an upper surface of the upper rubber layer 33, and a lower exudation preventing layer 36 positioned on a lower surface of the lower rubber layer 34.

21 Claims, 7 Drawing Sheets

CUSHIONING MATERIAL FOR FORMING PRESS

This application is a continuation of application Ser. No. 08/531,625 filed on Sep. 21, 1995, now abandoned.

BACKGROUND OF THE INVENTION

1. Field of the Invention

The present invention relates to cushioning material for forming press used for pressing of decorative laminates, printed circuit boards, copper-clad laminates (CCL), flexible printed circuit material (FPC), electrical laminates and so on.

2. Description of the Background Art

Referring to FIG. 1, when a laminate is to be manufactured by hot press, generally, an object to be pressed is interposed between heating platens 1 and 2, and a prescribed pressure and heat are applied thereto. At this time of pressing, as shown in the figure, metal mirror plates 4 and 5 are arranged at positions directly in contact with the object 3 to be pressed. Further, in order to apply uniform pressure and heat to the entire surface of the object to be pressed, a flat cushioning material 6 is positioned between heating platen 1 and metal mirror plate 4, and a flat cushioning material 7 is positioned between heating platen 2 and metal mirror plate 5.

A primary object of interposing cushioning materials 6 and 7 is to obtain a laminate having superior thickness precision and superior surface smoothness, by applying uniform pressure and uniform heat to the entire surface of the object 3 to be pressed. Therefore, cushioning property, thermal conductivity, heat resistance, durability, dimensional stability, surface releasing property and so on are necessary requirements of cushioning materials 6 and 7.

Several sheets, for example about 5 to about 20 sheets of kraft paper superimposed on one another have been long used as the cushioning material for forming press. The cushioning material consisting of kraft paper is inexpensive, and it exhibits superior cushioning property at the initial stage of use. However, durability for repetitive use is rather poor, and its working life is only one to at most 5 times of use. Because of such disadvantage, cushioning material formed of kraft paper has gone out of use recently.

Cushioning materials having various structures have been proposed as having improved durability.

One example includes a reinforcing woven fabric embedded in a rubber sheet 8, such as shown in FIG. 2. This cushioning material is superior to the one formed of kraft paper in its durability for repetitive use. However, since there is not a space in rubber, when it receives compressive force, side portions which are open expand, causing elongation or permanent set. This change in dimension affects the quality of the laminate to be pressed. In order to suppress such change in dimension, reinforcing woven fabric 9 is embedded. However, by the provision of reinforcing woven fabric 9, rubber elasticity is lost, and as a result, advantages of rubber sheet 8 such as good cushioning property and the effect of making uniform the pressure are lost. Further, since it does not have any space, thermal conductivity is so good that variation in temperature of heating platens is directly transmitted, causing variation in thermal conductivity.

FIG. 3 shows a cushioning material prepared by needle punching non-woven fabric layer 10 with reinforcing foundation fabrics 11 interposed therebetween. Reinforcing foundation fabric 11 embedded in non-woven fabric layer 10 may be one layer or two or more layers. This cushioning material has good cushioning property as non-woven fabric layer 10 includes spaces, and it also has good heat insulating effect. As for compressive force, unlike rubber, expansion in the direction of the side surfaces does not occur. In other words, dimensional stability with respect to compression is satisfactory.

Though the cushioning material formed of the needle punched non-woven fabric such as shown in FIG. 3 has the above described advantages, it suffers from the following disadvantages. A non-woven fabric essentially includes ups and downs at its surface and has uneven area weight. Such ups and downs at the surface and the uneven area weight causes variation in thermal conductivity and variation in pressure. In addition, needle punching leads to further unevenness in area weight. The ratio of spaces in the non-woven fabric decreases with long time of use, and therefore thermal conductivity and cushioning property change with time. By contrast, rubber layer 8 shown in FIG. 2 experiences less change with time, since it does not have any space.

A cushioning material shown in FIG. 4 includes rubber layers 13 with a reinforcing woven fabric 12 interposed therebetween, and needle punched non-woven fabric layers 14 and 15 such as shown in FIG. 3 on upper and lower surfaces of the rubber layers 13. The cushioning material has superior cushioning property of non-woven fabric layers 14 and 15 as well as superior stability with time of rubber layer 13. However, since non-woven fabric layers 14 and 15 are on the outermost surfaces, disadvantages of the non-woven fabric layer, that is, ups and downs of the surface and uneven area weight are directly reflected on the cushioning material.

A cushioning material shown in FIG. 5 is prepared by superimposing needle punched non-woven fabric layers 16 and 17 with an adhesive material 18, which is a glass cloth impregnated with epoxy resin, interposed. Since multiple layers of non-woven fabrics are superimposed in this manner, uneven area weight of each non-woven fabric layer can be offset to some extent. However, since non-woven fabric layers 16 and 17 still exist on the outermost surfaces, the aforementioned disadvantage inherent to the non-woven fabric layer cannot be thoroughly eliminated. Further, the adhesive material described above is hard, and therefore it cannot follow at all the change in shape of non-woven fabric layers 16 and 17 when compressive force is applied. Hence there is a possible problem of separation of the adhesive material caused by damage of glass cloth when the cushioning material is used for a long period of time.

A cushioning material 19 shown in FIG. 6 is a paper-like material prepared by mixing aromatic polyamide fiber and rock wool. The cushioning material has superior heat resistance, experiences small change in dimension thanks to its material, and it also has the advantage of smaller variation of area weight. However, it has the following disadvantages. Namely, it has poor cushioning property, it has small ups and downs on its surface as it includes fiber material, and layers tend to separate from each other.

FIG. 7 shows a cushioning material for forming press disclosed in Japanese Patent Publication No. 47-46945. The cushioning material has rubber layers 21 and 22 on an upper surface and a lower surface of a needle punched non-woven fabric layer 20. It is described that silicone rubber, nitrile rubber, butyl rubber or the like may be used for the rubber layer. FIG. 8 is an enlargement of the cross section of FIG. 7.

The cushioning material shown in FIG. 7 has superior cushioning property of the needle punched non-woven fabric, as well as the effect of making uniform the pressure because of rubber elasticity of the surface rubber layers. Different from the cushioning materials shown in FIGS. 3 to 5, the cushioning material has rubber layers 21 and 22 positioned on the upper and lower surfaces of needle punched non-woven fabric layer 20. Therefore, it is superior in that undesirable influences of ups and downs of the surface and uneven area weight of the needle punched non-woven fabric can be offset by the rubber layers 21 and 22. This is because the unevenness of area weight and ups and downs of the surface can be absorbed by fluidized rubber entering irregular spaces of the fibers at the surface of non-woven fabric layer at the interface between non-woven fabric layer 20 and rubber layers 21 and 22 as shown in FIG. 8, when rubber layers 21 and 22 are vulcanized and bonded to non-woven fabric layer 20 during the steps of manufacturing the cushioning material.

However, the cushioning material for forming press disclosed in Japanese Patent Publication No. 47-46945 has the following disadvantages.

First, since there is not a reinforcing material interposed in needle punched non-woven fabric layer 20 at all, needle punched non-woven fabric layer 20 moves following the change in shape of rubber layers 21 and 22 when the cushioning material is used, resulting in uneven pressure.

Secondly, rubber layers 21 and 22 are not sufficient to remove the undesired influence of uneven area weight of the non-woven fabric layer.

Third problem is the undesired influence caused by exudation of compounding agent contained in rubber layers 21 and 22. While the cushioning material is used under heat and pressure, compounding agent having low molecular weight exudes to the surfaces of rubber layers 21 and 22. When the exudation is left as it is, appearance of the cushioning material for forming press would be damaged, and in addition, there is a possibility that the exudation stains the mirror plate or the laminate to be pressed, or that the cushioning material is adhered to the mirror plate or the heating platen. In order to prevent exudation of the compounding agent, an exudation preventing layer such as a film or a metal foil may be adhered on the surfaces of rubber layers 21 and 22. However, actually, this approach has been not very successful, since an adhesive agent which is set causes uneven distribution of pressure, resulting in uneven pressurization, and poor heat resistance of the adhesive agent leads to the problem of uneven thermal conductivity or the problem of separation.

SUMMARY OF THE INVENTION

An object of the present invention is to provide a cushioning material for forming press which allows transmission of uniform pressure to the entire surface for a long period of time.

Another object of the present invention is to provide a cushioning material for forming press which exhibits uniform thermal conductivity over the entire surface.

A still further object of the present invention is to provide a cushioning material for forming press having superior dimensional stability.

A still further object of the present invention is to provide a cushioning material for forming press which neither stains a mirror plate or a laminate to be pressed, nor adheres to the mirror plate or a heating platen.

The cushioning material for forming press in accordance with the present invention includes two or more fiber material layers, a bonding material layer positioned between each of the fiber material layers for bonding upper and lower fiber material layers, an upper rubber layer positioned on an upper surface of an uppermost fiber material layer, and a lower rubber layer positioned on a lower surface of a lowermost fiber material layer.

Porous fiber material having spaces therein is preferred as the fiber material layer. Since such porous fiber material layer has spaces therein, it exhibits superior cushioning property. Non-woven fabric, woven fabric or paper may be employed as such fiber material layer.

Since rubber layers are provided on the upper surface of the uppermost fiber material layer and on the lower surface of the lowermost fiber material layer, when the rubber layers are superimposed on the fiber material layers and vulcanized and bonded during the steps of manufacturing the cushioning material, the fluidized rubber enters irregular spaces of the fiber on the surface of the fiber material layers at the interface between the fiber material layers and the rubber layers. As a result, uneven area weight and ups and downs of the surface of the fiber material layers are absorbed by the rubber layer. Accordingly, undesirable influence caused by unevenness of the fiber can be prevented, and uniform pressure distribution and uniform thermal conductivity can be obtained.

Preferably, the cushioning material for forming press in accordance with the present invention includes, for the purpose of improving releasing property, an upper releasing layer positioned on the upper surface of the upper rubber layer and a lower releasing layer positioned on the lower surface of the lower rubber layer. A synthetic resin film, a metal foil, a woven fabric, paper or the like may be used as the releasing layer.

More preferably, the upper releasing layer serves as an upper exudation preventing layer for preventing exudation of the compounding agent included in the upper rubber layer, and the lower releasing layer serves as a lower exudation preventing layer for preventing exudation of the compounding agent included in the lower rubber layer. In this case, since the exudation preventing layers are provided on the surfaces of rubber layers, the compounding agent having low molecular weight included in rubber never exudes. Therefore, stain can be prevented and releasing property can be improved.

The exudation preventing layer is preferably formed of a film-like material having both impermeability to air and releasing property. Such a material specifically includes a synthetic resin film, a metal foil and the like. Though a woven fabric and paper have air permeability, these may be used as exudation preventing layer when they are treated to have impermeability to air, for example by coating a synthetic resin liquid, laminating a synthetic resin film or by heat treating surfaces of these. When the woven fabric or paper is to be used as the exudation preventing layer by providing coating of synthetic resin liquid, polyimide resin, fluoride resin, melamine resin, acrylic resin or the like may be used as the synthetic resin liquid.

All the fiber material layers may be formed of the same material, or they may differ. When all the fiber material layers are of the same material, coefficient of thermal expansion of all the fiber material layers is the same, therefore warp is not generated in the cushioning material, and uniform pressure distribution and uniform thermal conductivity can be easily obtained. Further, manufacturing is easy.

If fiber material layers are formed of different materials, advantages of respective materials can be synergistically obtained, while disadvantages of respective materials can be offset. However, different materials of fiber material layers have different coefficients of thermal expansion, and therefore in order to prevent warp of the cushioning material, combination of the materials in the upper portion and the lower portion should preferably by symmetrical.

In one embodiment, the bonding material layer has an adhesive agent. A heat resistant rubber or synthetic resin adhesive agent may be used, or alternatively, a liquid type or sheet type adhesive agent may be used. Preferable example includes fluoroelastomer adhesive agent, silicone rubber adhesive agent, hydrogenated nitrile rubber adhesive agent, EPM adhesive agent, EPDM adhesive agent, acrylic rubber adhesive agent, NBR adhesive agent, epoxy resin adhesive agent, polyimide resin adhesive agent and so on.

In the present invention, two or more fiber material layers are laminated to obtain multilayered structure with a bonding material layer interposed. Therefore, uneven area weight of each fiber material layer can be offset, and precision of area weight of the cushioning material as a whole can be improved. Therefore, uniform pressure distribution and uniform thermal conductivity can be obtained. The larger the number of fiber material layers to be laminated, the higher the precision of area weight.

In one embodiment, the bonding material layer has a sheet-like base material which suffers from small amount of deformation in the planar direction when subjected to heat or pressure, and an adhesive agent applied on opposing surfaces of the base material. An woven fabric, a synthetic resin film, a metal foil, inorganic fiber paper may be used as the base material. As the adhesive, heat resistant rubber or synthetic resin adhesive agent may be used. More specifically, fluoroelastomer adhesive agent, silicone rubber adhesive agent, hydrogenated nitrile rubber adhesive agent, EPM adhesive agent, EPDM adhesive agent, acrylic rubber adhesive agent, NBR adhesive agent, epoxy resin adhesive agent, polyimide resin adhesive agent or the like may be used. Fluoroelastomer adhesive agent, EPDM adhesive agent or polyimide resin adhesive agent is preferable.

In this embodiment also, two or more fiber material layers are laminated to obtain multilayered structure with a bonding material layer interposed, so that unevenness area weight of each fiber material layer can be offset and precision of area weight of the cushioning material as a whole can be improved. As a result, uniform pressure distribution and uniform thermal conductivity can be obtained. As the cushioning material is used repetitively and repeatedly subjected to heat and pressure, the rubber layer tends to expand in the planar direction. However, as the bonding material layer suppressing movement of the fiber material layer in the planar direction is placed between the fiber materials, movement of the fiber material layers following the expansion of the rubber layer can be prevented. Therefore, dimensional variation can be suppressed even when the material is used for a long period of time, and uniform distribution of pressure is maintained.

In one embodiment, the bonding material layer is a rubber sheet. In this case, the rubber sheet may be one in which reinforcing woven fabric is embedded.

In one embodiment, the fiber material layer is a non-woven fabric, the bonding material layer is a foundation fabric, and the non-woven fabric and the foundation fabric are bonded by tangling between the fibers and the foundation fabric caused by needle punching. When the cushioning material is used repeatedly and subjected to repeated heat and pressure, the rubber layer tends to expand in the planar direction. However, since the fiber material layer is reinforced by the foundation fabric, movement of the fiber material layer following the expansion of the rubber layer can be prevented. Therefore, dimensional variation can be suppressed even if the cushioning material is used for a long period of time, and uniform distribution of pressure can be maintained.

In this embodiment, an adhesive agent may be applied to the foundation fabric so that the non-woven fabric and the foundation fabric are bonded not only by the tangling between fibers and foundation fabric caused by needle punching but also by adhesion by the adhesive agent. This results in firm bonding and further improvement of dimensional stability.

In one embodiment, the fiber material layer is a non-woven fabric and a first bonding material layer is a foundation fabric. The non-woven fabric and the foundation fabric are bonded by tangling between the fibers and the foundation fabric caused by needle punching. A second bonding material layer has an adhesive agent. As for the lamination of the fiber material layer and the bonding material layer, multiple stages of bonded non-woven fabric layers prepared by bonding two or more non-woven fabric layers by means of the first bonding material layer are laminated by means of the second bonding material layer. According to this embodiment, since the bonded non-woven fabric layer is reinforced by the foundation fabric, it has good dimensional stability. Since the bonded non-woven fabric layers are laminated in multiple stages by means of the second bonding material layer, unevenness of area weight of the bonded non-woven fabric layers can be offset, precision of area weight of the cushioning material as a whole can be improved, and hence uniform pressure distribution and uniform thermal conductivity can be obtained. The larger the number of lamination, the better the precision of area weight. As in the above described embodiments, heat resistant rubber adhesive agent or synthetic resin adhesive agent may be used as the adhesive agent.

In the above described embodiment, the second bonding material layer has a sheet-like base material which suffers from small amount of deformation in planar direction when subjected to heat or pressure, and an adhesive agent applied on opposing surfaces of the base material. This contribute to further improvement of the dimensional stability of the cushioning material as a whole.

In the above embodiment, an adhesive agent is applied to the foundation fabric of the first bonding material layer, for example. The non-woven fabric and the foundation fabric are bonded by tangling between the fibers and the foundation fabric caused by needle punching as well as by adhesion by adhesive agent. This further improves dimensional stability of the bonded non-woven fabric layer, and hence dimensional stability of the cushioning material as a whole can be improved.

When the bonding material layer has an adhesive agent, preferably, a fluoroelastomer adhesive agent is used. Fluoroelastomer adhesive agent has superior heat resistance. Further, since it is rubber adhesive agent, it exhibits superior flexibility even after vulcanization and bonding, not deteriorating cushioning property of the fiber material layer.

Generally, polyamide fiber, polyester fiber, melamine fiber, polyphenylene sulfide fiber or the like is used for the fiber material layer. Preferably, a heat resistance fiber, of which glass transition temperature is at least 200° C. and the temperature at which weight loss of 10% is caused by thermal decomposition is at least 400° C., is used. Such heat resistant fiber may be heat resistant organic fiber or inorganic fiber. The heat resistant organic fiber includes aromatic polyimide fiber, polyamide fiber, aromatic polyester fiber and so on. The inorganic fiber includes glass fiber, rock wool fiber, silica fiber, metal fiber and the like. One of these heat resistant fibers or two or more of these mixed are used in the form of non-woven fabric, woven fabric or paper.

In a preferred embodiment, an acrylic monomer is added in the composition forming the upper and lower rubber layers. Addition of acrylic monomer allows direct adhesion between the rubber layer and the releasing layer, without inserting an adhesive agent layer. Therefore, the manufacturing process can be simplified.

In a preferred embodiment, the upper rubber layer and the upper releasing layer are adhered without any adhesive agent, and the lower rubber layer and the lower releasing layer are adhered without any adhesive agent. As the rubber layer and the releasing layer are adhered without adhesive agent, unevenness of pressure and of thermal conductivity caused by the adhesive agent can be prevented.

Preferably, the temperature at which weight loss of 10% is caused by thermal decomposition of upper and lower rubber layers is at least 380° C. A heat resistant rubber may be used as a material of the rubber layer. More specifically, fluoroelastomer, EPM, EPDM, hydrogenated nitrile rubber, silicone rubber, acrylic rubber, butyl rubber are preferable. These rubber materials may be used by itself, or blended or mixed with other organic or inorganic material. The compounding agent and the compounding ratio of the rubber layer mainly formed of the rubber material should preferably be adjusted so that the temperature at which the weight loss of 10% is caused by thermal decomposition is at least 380° C.

Preferably, the primary component of the upper and lower rubber layers is a highly heat resistant fluoroelastomer.

More preferably, the upper and lower releasing layers are formed by a fluoride resin film serving as the exudation preventing layer. The property required of the exudation preventing layer is that exudation of the compounding agent in the rubber layer can be effectively prevented. Further, a material having modulus of elasticity close to that of rubber is preferable. If such requirements are satisfied, the elasticity of the rubber layer can be effectively utilized on the surfaces of the cushioning material, so that unevenness of pressure caused by ups and downs of the surfaces of the heating platen and the mirror plate can be absorbed by the rubber layer, and thermal expansion or contraction of the heating platen and the mirror plate can be followed. Thus uniform pressure distribution and uniform thermal conductivity can be obtained.

In view of the foregoing, the exudation preventing layer should preferably be formed by a fluoride resin film. Among fluoride resin films, tetrafluoroethylene-perfluoroalkylvinyl ether copolymer (PFA) and tetrafluoroethylene-hexafluoropropylene copolymer (FEP) are particularly preferable. When a fluoride resin film is used as the exudation preventing layer, it is effective if it has the thickness in the range of from 10 μm to 200 μm. Preferable range of thickness is from 50 μm to 100 μm.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Embodiment 1

Figure 9:
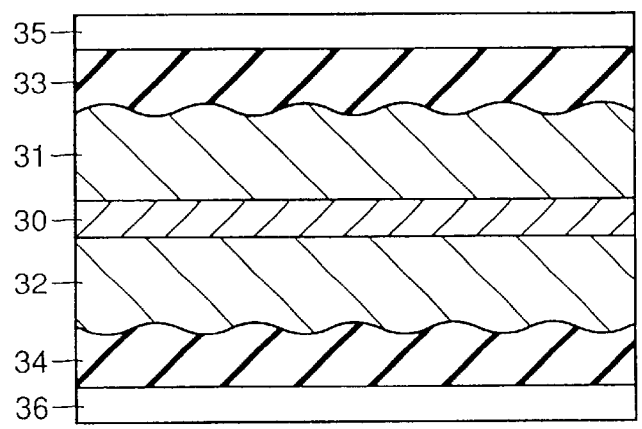
FIG. 9 is a cross section showing an embodiment of the present invention.

The cushioning material for forming press shown in FIG. 9 includes two fiber material layers 31 and 32 positioned on upper and lower sides of a bonding material layer 30, respectively, an upper rubber layer 33 positioned on an upper surface of one fiber material layer 31, a lower rubber layer 34 positioned on a lower surface of the other fiber material layer 32, an upper exudation preventing layer 35 positioned on an upper surface of upper rubber layer 33 for preventing exudation of a compounding agent contained in upper rubber layer 33, and a lower exudation preventing layer 36 positioned on a lower surface of lower rubber layer 34 for preventing exudation of a compounding agent contained in lower rubber layer 34. A non-woven fabric, woven fabric or paper is used as fiber material layers 31 and 32. These two fiber material layers 31 and 32 may be formed of the same material or different materials.

As the upper and lower rubber layers 33 and 34, rubber having heat resistance may be used. For example fluoroelastomer, EPM, EPDM, hydrogenated nitrile rubber, silicone rubber, acrylic rubber, butyl rubber or the like may be used. Preferably, fluoroelastomer containing acrylic monomer is used. The acrylic monomer includes tetrahydrofurfuryl methacrylate, methoxy diethylene glycol methacrylate, phenoxy ethyl acrylate, phenoxy diethylene glycol acrylate, ethylene dimethacrylate, 1,3-butylene dimethacrylate, 1,4-butylene dimethacrylate, 1,6-hexanediol dimethacrylate, polyethylene glycol dimethacrylate, 1,4-butanediol diacrylate, 1,6-hexanediol diacrylate, 2,2'-bis(4- methacryloxy diethoxy phenyl) propane, 2,2'-bis(4-acryloxy diethoxy phenyl) propane, trimethylol propane triacrylate, trimethylol propane trimethacrylate and pentaerythritol triacrylate.

By adding acrylic monomer to the rubber, it becomes possible to directly adhere the rubber layer to the exudation preventing layer, without using any adhesive agent layer.

In view of flexibility, heat resistance and releasing property, fluoride resin film is most preferable as the exudation preventing layers 35 and 36. However, other materials can also be used.

As already described, the exudation preventing layers 35 and 36 are directly adhered to rubber layers 34 and 35 without interposing any adhesive agent, and therefore the problems of uneven pressure and uneven temperature caused by the adhesive agent layer can be avoided.

Embodiment 2

Figure 10:
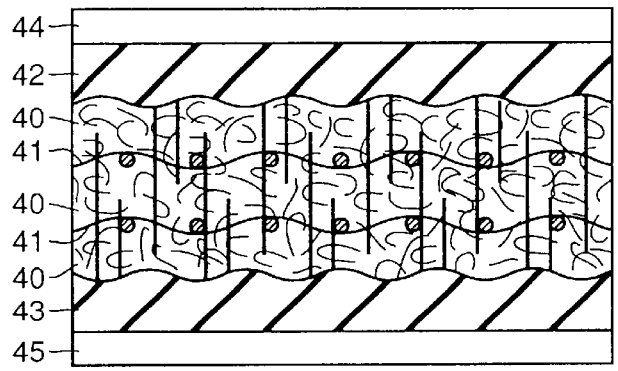
FIG. 10 is a cross section showing another embodiment of the present invention.

The cushioning material for forming press shown in FIG. 10 includes a non-woven fabric layer 40 containing a bonding material layer 41 therein, an upper rubber layer 42 positioned on an upper surface of non-woven fabric layer 40, a lower rubber layer 43 positioned on a lower surface of non-woven fabric layer 40, an upper exudation preventing layer 44 positioned on an upper surface of upper rubber layer 42, and a lower exudation preventing layer 45 positioned on a lower surface of lower rubber layer 43.

Non-woven fabric layer 40 is formed of aromatic polyamide fiber. Bonding material 41 is a foundation fabric formed of aromatic polyamide fiber. Non-woven fabric layer 40 and foundation fabric 41 are needle punched, so that fibers enter meshes of the foundation fabric. Thus, by the tangling of fibers and the foundation fabric, expansion of the non-woven fabric layer 40 in the planar direction is suppressed, and as a result, dimension in the thickness direction also is stabilized.

The material of the upper and lower rubber layers 42 and 43 is fluoroelastomer containing acrylic monomer. Exudation preventing layers 44 and 45 are fluoride resin films.

Embodiment 3

Figure 11:
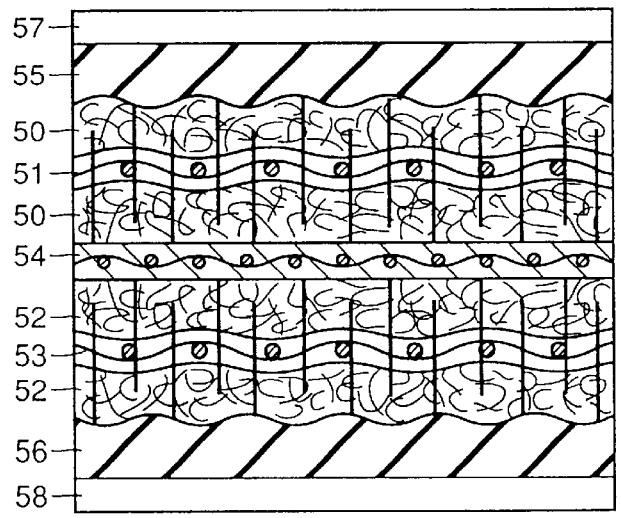
FIG. 11 is a cross section showing a further embodiment of the present invention.

A cushioning material for forming press shown in FIG. 11 includes a lamination of a non-woven fabric layer 50 including a first bonding material layer 51 therein and a non-woven fabric layer 52 including a first bonding material layer 53 therein, with a second bonding material layer 54 interposed. An upper rubber layer 55 is positioned on an upper surface of non-woven fabric layer 50, and on its upper surface, an upper exudation preventing layer 57 is positioned. A lower rubber layer 56 is positioned on a lower surface of the other non-woven fabric layer 52, and on its lower surface, a lower exudation preventing layer 58 is positioned.

Figure 12:
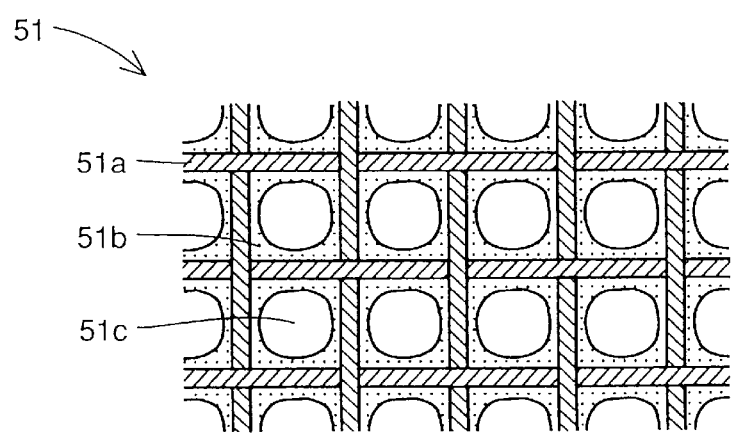
FIG. 12 illustrates structure of a first bonding material layer 51 shown in FIG. 11.

FIG. 12 illustrates the structure of the first bonding material layer 51. The other first bonding material layer 53 has the identical structure. As is shown in the figure, first bonding material layer 51 includes an open weave glass cloth 51a to which fluoroelastomer adhesive 51b is applied not sealing the mesh of the glass cloth.

First bonding material layer 51 and non-woven fabric layer 50 are needle punched, and similarly, the other first bonding material layer 53 and non-woven fabric layer 52 are needle punched. As shown in FIG. 12, first bonding material layer 51 has meshes 51c, and therefore fibers enter the meshes 51c. In this manner, by tangling of the fibers and the bonding material layer, expansion of non-woven fabric layers 50 and 52 in the planar direction is suppressed, and as a result, dimension in the thickness direction also is stabilized.

An aromatic polyamide fiber is used as the non-woven fabric layers 50 and 52. The area weight of non-woven fabric layer 50 needle punched including the first bonding material layer 51 and the area weight of non-woven fabric layer 52 needle punched including the first bonding material layer 53 are both 650 g/m$^2$.

The second bonding material layer 54 is a glass cloth, to opposing surfaces of which fluoroelastomer adhesive agent is applied. The material of the upper and lower rubber layers 55 and 56 is a fluoroelastomer containing acrylic monomer. The material of the upper and lower exudation preventing layers 57 and 58 is a fluoride resin film. As compared with Embodiment 2, the advantages of Embodiment 3 are as follows.

First, since the first bonding material layer and the non-woven fabric layer are bonded not only by the tangling of fibers but also by adhesion, bonding force is stronger than when they are bonded simply by needle punching. Therefore, dimensional stability of the bonded non-woven fabric layers (50 and 51 as well as 52 and 53) is improved.

Further, since two bonded non-woven fabric layers are superimposed with the second bonding material layer 54 interposed, unevenness of the area weight of respective bonded non-woven fabric layers can be offset, thus improving precision of area weight.

Further, since a fluoroelastomer adhesive agent is used, it has superior heat resistance. Further, since it has superior flexibility, cushioning property of the fiber material layer is not degraded.

Embodiment 4

Figure 13:
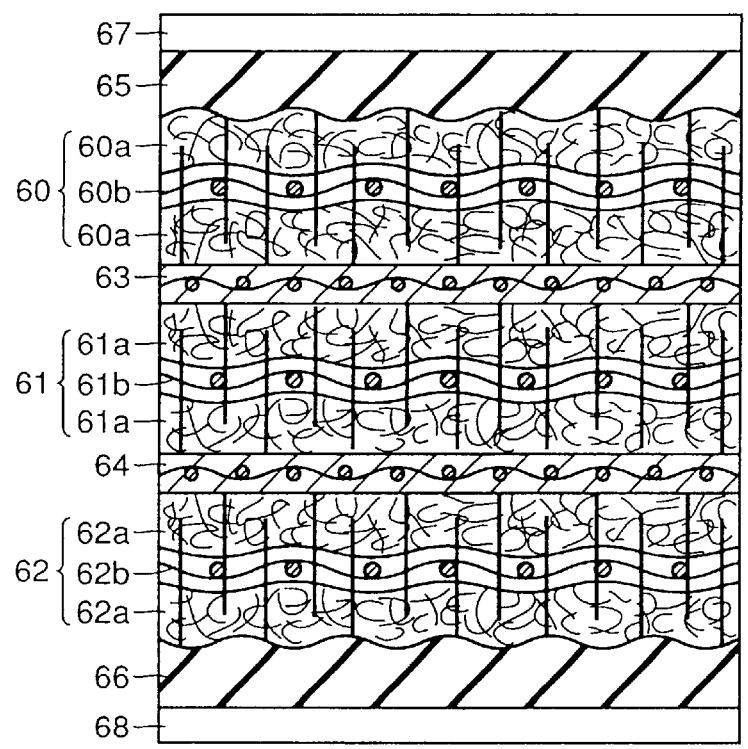
FIG. 13 is a cross section showing a still further embodiment of the present invention.

A cushioning material for forming press shown in FIG. 13 includes three bonded non-woven fabric layers 60, 61 and 62. Bonded non-woven fabric layers 60, 61 and 62 are non-woven fabric layers 60a, 61a, and 62a including first bonding material layers 60b, 61b and 62b therein, respectively, and these are needle punched. Area weight of each of the bonded non-woven fabric layers 60, 61 and 62 is 450 g/m$^2$.

The bonded non-woven fabric layers 60, 61 and 62 are bonded by means of second bonding material layers 63 and 64. On an upper surface of the uppermost bonded non-woven fabric layer 60, an upper rubber layer 65 is positioned, and on its upper surface, an upper exudation preventing layer 67 is positioned. On a lower surface of the lowermost bonded non-woven fabric layer 62, a lower rubber layer 66 is positioned, and on its lower surface, a lower exudation preventing layer 68 is positioned.

Structures of the first bonding material layers 60b, 61b and 62b are the same as that shown in FIG. 12. Non-woven fabric layers 60a, 61a and 62a are formed of aromatic polyamide fiber. The second bonding material layers 63 and 64 are prepared by applying fluoroelastomer adhesive to opposing surfaces of a glass cloth.

The material of rubber layers 65 and 66 is a fluoroelastomer including acrylic monomer. Exudation preventing layers 67 and 68 are formed of fluoride resin films.

The structure of Embodiment 4 differs from that of Embodiment 3 first in that three bonded non-woven fabric layers are superimposed, and secondly, that the area weight of the bonded non-woven fabric layer is small. Since a number of bonded non-woven fabric layers each having smaller area weight are superimposed, the precision of area weight as a whole can be improved. However, as for the cushioning property, that of the second embodiment is superior.

Embodiment 5

Figure 14:
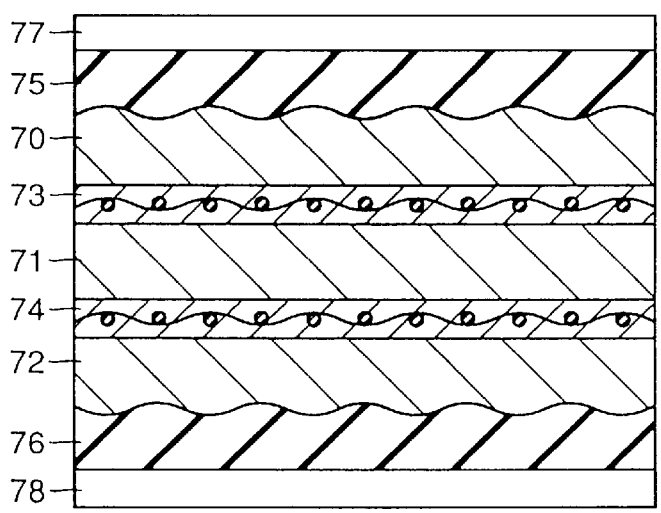
FIG. 14 is a cross section showing a still further embodiment of the present invention.

A cushioning material for forming press shown in FIG. 14 includes three paper layers 70, 71 and 72. The paper layer is paper like material prepared by mixing aromatic polyamide fiber and rock wool. The paper layers 70, 71 and 72 are bonded by means of bonding material layers 73 and 74. Bonding material layers 73 and 74 are prepared by applying a fluoroelastomer adhesive agent on opposing surfaces of a glass cloth.

On an upper surface of the uppermost paper layer 70, an upper rubber layer 75 is positioned, and on its upper surface, an upper exudation preventing layer 77 is positioned. On a lower surface of the lowermost paper layer 72, a lower rubber layer 76 is positioned, and on its lower surface, a lower exudation preventing layer 78 is positioned. Upper and lower rubber layers 75 and 76 are formed of a fluoroelastomer including acrylic monomer. Exudation preventing layers 77 and 78 are fluoride resin films.

The feature of Embodiment 5 is as follows.

The area weight and the thickness precision of the paper layer itself are better than those of non-woven fabric. Therefore, precision of area weight as a whole can be improved. Further, since rubber layers are superimposed on the surfaces, cushioning property is better as compared with conventional cushioning material formed of paper made by mixing materials. Further, it does not have any ups and downs on its surfaces. However, as compared with Embodiments 2, 3 and 4 above and Embodiments 6, 7 and 8 which will be described in the following, cushioning property is inferior.

Embodiment 6

Figure 15:
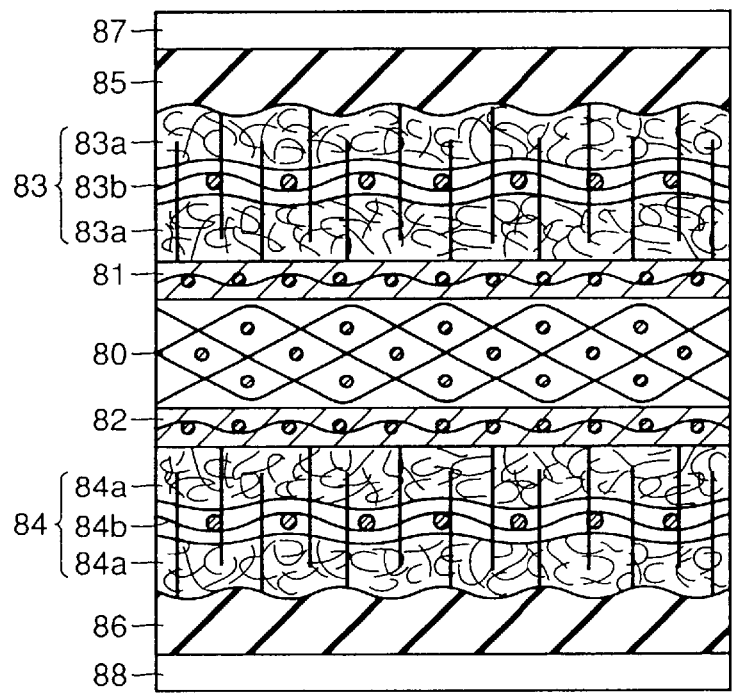
FIG. 15 is a cross section showing a still further embodiment of the present invention.

A cushioning material for forming press shown in FIG. 15 has a woven fabric layer 80 at its center, and bonding material layers 81 and 82 on its upper and lower surfaces. On an upper surface of one bonding material layer 81, a bonded non-woven fabric layer 83 is positioned. Bonded non-woven fabric layer 83 includes non-woven fabric layer 83a needle punched together with a bonding material layer 83b therein. On a lower surface of the other bonding material layer 82, a bonded non-woven fabric layer 84 is positioned. Bonded non-woven fabric layer 84 also includes a non-woven fabric layer 84a which is needle punched together with a bonding material layer 84b therein.

On an upper surface of upper bonded non-woven fabric layer 83, an upper rubber layer 85 is positioned, and further on its upper surface, an upper exudation preventing layer 87 is positioned. On a lower surface of lower bonded non-woven fabric layer 84, a lower rubber layer 86 is positioned, and on its lower surface, a lower exudation preventing layer 88 is positioned.

The woven fabric layer 80 is formed of a multiple-ply woven cloth of aromatic polyamide fiber. Bonding material layers 81 and 82 are prepared by applying a fluoroelastomer adhesive agent on opposing surfaces of a glass cloth. Bonded non-woven fabric layers 83 and 84 have the same structure as the bonded non-woven fabric layer of Embodiment 4.

Rubber layers 85 and 86 are of fluoroelastomer including acrylic monomer, and exudation preventing layers 87 and 88 are fluoride resin films.

The feature of Embodiment 6 is that unevenness of area weight and poor dimensional stability which are the inherent disadvantages of the non-woven fabric are compensated for by the woven fabric layer 80, and that superior cushioning property, which is the advantage of the non-woven fabric, is fully exhibited.

Embodiment 7

Figure 16:
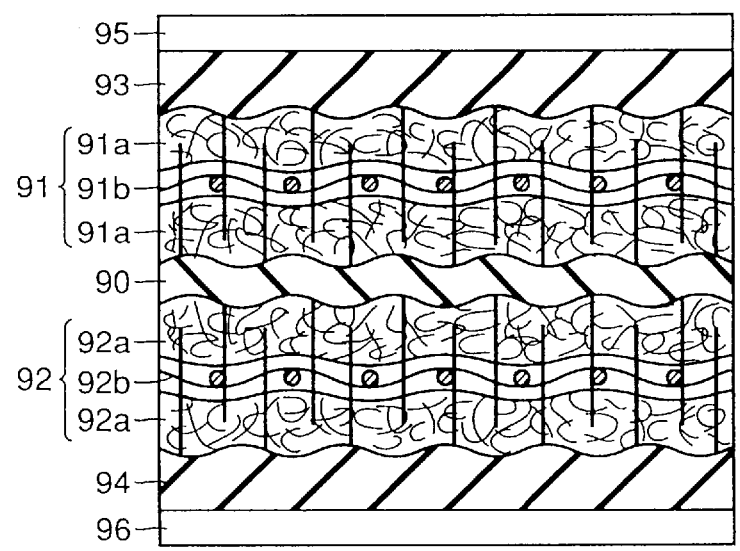
FIG. 16 is a cross section showing a still further embodiment of the present invention.

A cushioning material for forming press shown in FIG. 16 includes two bonded non-woven fabric layers 91 and 92 superimposed with a second bonding material layer 90 interposed. On an upper surface of one bonded non-woven fabric layer 91, an upper rubber layer 93 is positioned, and on its upper surface, an upper exudation preventing layer 95 is positioned. On a lower surface of a lower bonded non-woven fabric layer 92, a lower rubber layer 94 is positioned, and on its lower surface, a lower exudation preventing layer 96 is positioned. The upper bonded non-woven fabric layer 91 includes a non-woven fabric layer 91a needle punched together with a bonding material layer 91b therein. The lower bonded non-woven fabric layer 92 also includes a non-woven fabric layer 92a needle punched together with a bonding material layer 92b therein.

Except that second bonding material layer 90 is formed by a fluoroelastomer sheet, the structure of Embodiment 7 shown in FIG. 16 is the same as Embodiment 3 shown in FIG. 11.

The feature of Embodiment 7 is that it has greater effect of absorbing unevenness in pressure derived from uneven area weight and ups and downs of the surfaces of the non-woven fabric layer.

Embodiment 8

Figure 17:
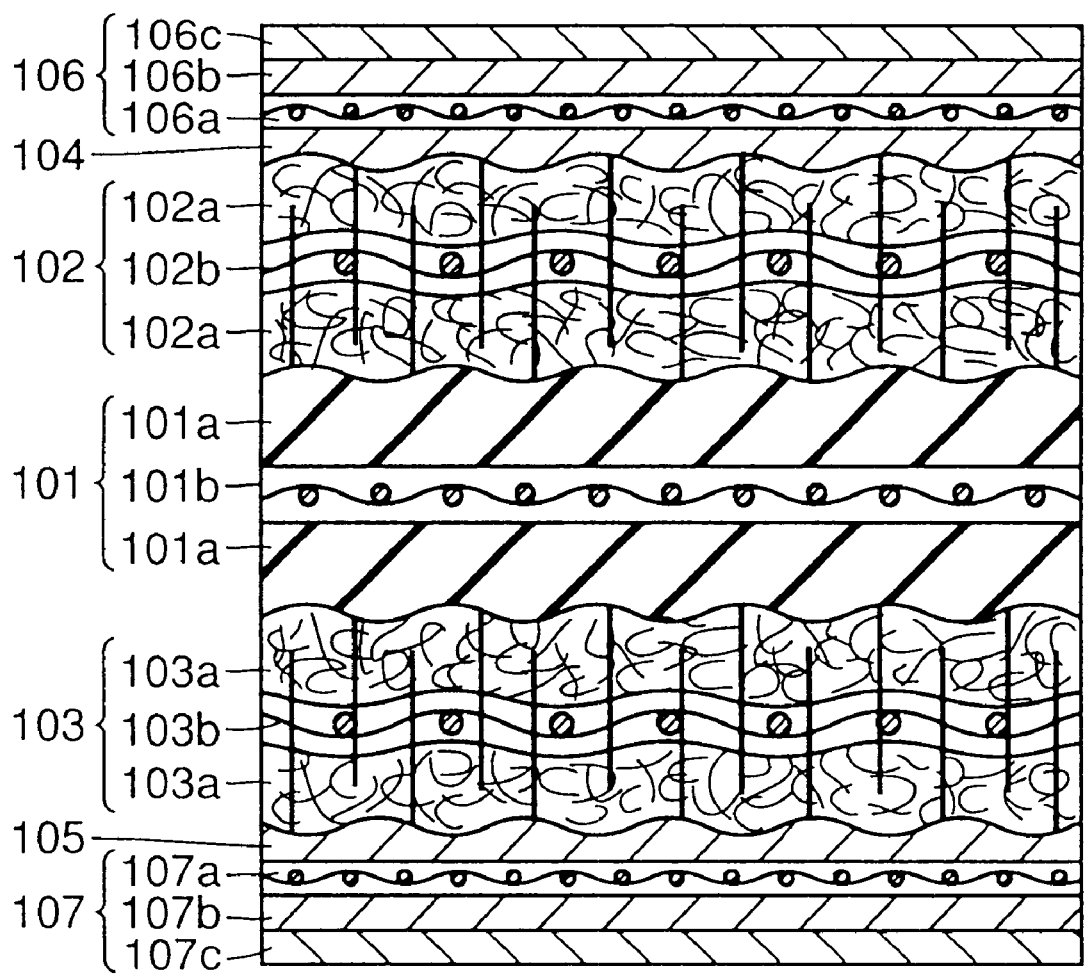
FIG. 17 is a cross section showing a still further embodiment of the present invention.

A cushioning material for forming press shown in FIG. 17 includes two bonded non-woven fabric layers 102 and 103 superimposed with a second bonding material layer 101 interposed. The upper bonded non-woven fabric layer 102 is prepared by needle punching a non-woven fabric layer 102a formed of an aromatic polyamide fiber and a bonding material layer 102b therein. Similarly, the lower bonded non-woven fabric layer 103 is prepared by needle punching a non-woven fabric layer 103a formed of an aromatic polyamide fiber with a bonding material layer 103b positioned therein. Bonding material layers 102b and 103b have the same structure as the first bonding material layer 51 used in Embodiment 3.

The second bonding material layer 101 includes a fluoroelastomer sheet 101a and a reinforcing woven fabric 101b of glass cloth embedded therein.

On an upper surface of the upper bonded non-woven fabric layer 102, a rubber layer 104 is positioned, and further thereon, an upper exudation preventing layer 106 is positioned. On a lower surface of the lower bonded non-woven fabric layer 103, a lower rubber layer 105 is positioned, and further therebelow, a lower exudation preventing layer 107 is positioned.

The upper and lower exudation preventing layers 106 and 107 include glass cloths 106a and 107a, fluoroelastomers 106b and 107b applied thereto, and polyimide resin 106c and 107c applied further thereto. Upper and lower rubber layers 104 and 105 are fluoroelastomer applied to the rear surfaces of upper and lower exudation preventing layers 106 and 107.

(Comparison of Properties)

Properties of conventional cushioning materials for forming press and of the cushioning materials for forming press in accordance with the present invention were compared. The structures of the cushioning materials compared were as follows.

EXAMPLE 1 FOR COMPARISON

A stack of 15 sheets of kraft paper.

EXAMPLE 2 FOR COMPARISON

Figure 1:
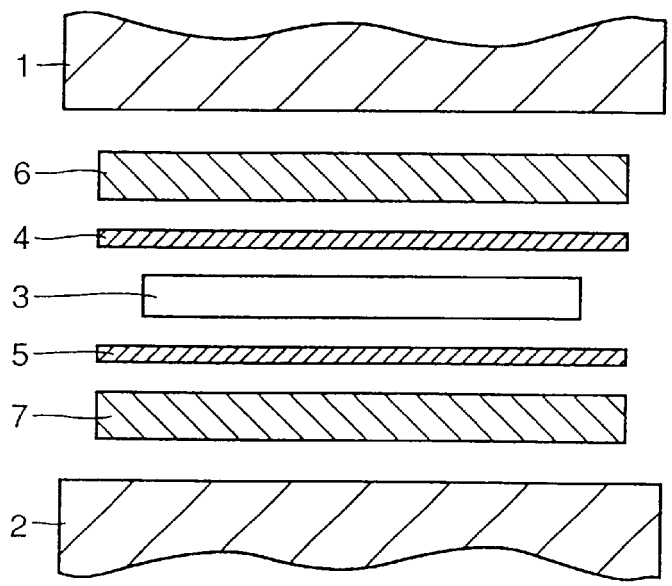
FIG. 1 is a cross section showing various elements for pressing an object, arranged superimposed.
Figure 2:
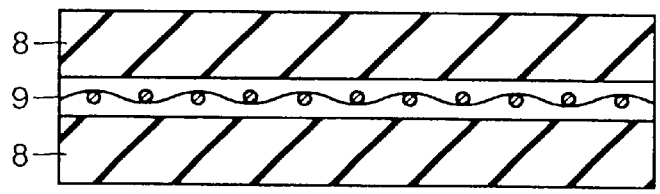
FIG. 2 is a cross section showing an example of a conventional cushioning material for forming press.

This example has the structure shown in FIG. 2. Silicone rubber was used as rubber sheet 8, and a plain woven fabric of an aromatic polyamide fiber was used as reinforcing woven fabric 9.

EXAMPLE 3 FOR COMPARISON

Figure 3:
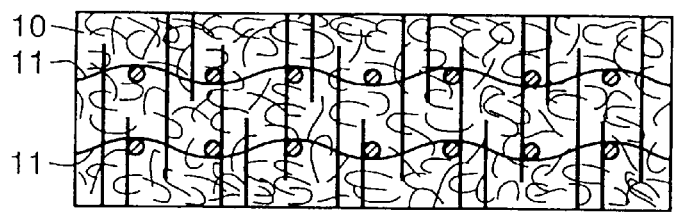
FIG. 3 is a cross section showing another example of the conventional cushioning material for forming press.

This example has the structure shown in FIG. 3. An aromatic polyamide fiber was used as needle punched non-woven fabric 10 and a foundation fabric of an aromatic polyamide fiber was used as reinforcing foundation fabric 11.

EXAMPLE 4 FOR COMPARISON

Figure 4:
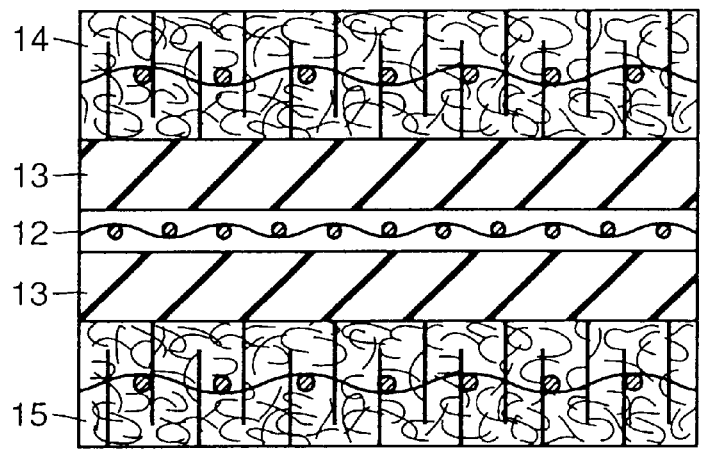
FIG. 4 is a cross section showing a still further example of the conventional cushioning material for forming press.

This example has the structure shown in FIG. 4. An aromatic polyamide fiber was used as needle punched non-woven fabric 14, a foundation fabric of an aromatic polyamide fiber was used as the reinforcing foundation fabric, EPDM was used as rubber layer 13, and a mock leno of glass cloth was used as the reinforcing woven fabric 12.

EXAMPLE 5 FOR COMPARISON

Figure 5:
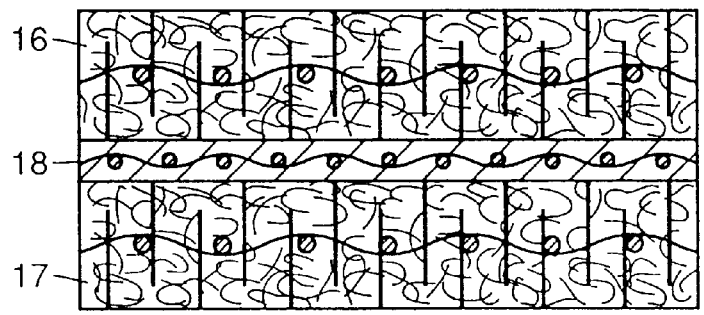
FIG. 5 is a cross section showing a still further example of the conventional cushioning material for forming press.

This example has the structure shown in FIG. 5. An aromatic polyamide fiber was used as needle punched non-woven fabric 16, a foundation fabric of an aromatic polyamide fiber was used as the reinforcing foundation fabric, and an adhesive material of a glass cloth impregnated with epoxy resin was used as adhesive material layer 18.

EXAMPLE 6 FOR COMPARISON

Figure 6:
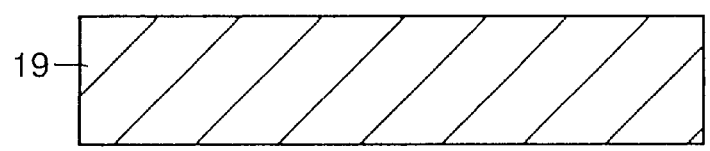
FIG. 6 is a cross section showing a still further example of the conventional cushioning material for forming press.

This example has the structure shown in FIG. 6. As paper like material 19 formed by mixing, a paper like material prepared by mixing an aromatic polyamide fiber and rock wool was used.

EXAMPLE 7 FOR COMPARISON

Figure 7:
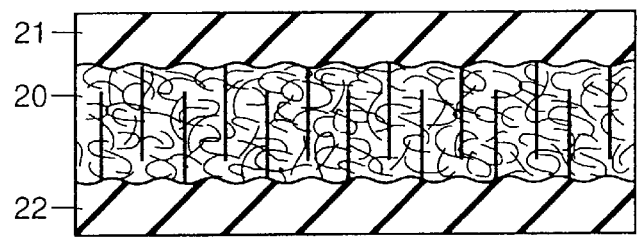
FIG. 7 is a cross section showing a still further example of the conventional cushioning material for forming press.
Figure 8:
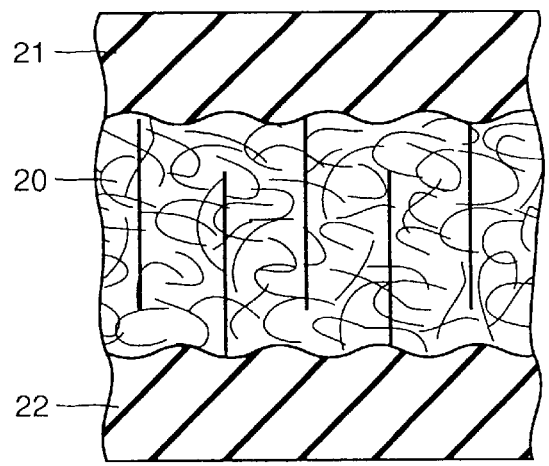
FIG. 8 is a cross section showing, in enlargement, a portion of FIG. 7.

This example has the structure shown in FIG. 7. Silicone rubber was used for rubber layer 21, and an aromatic polyamide fiber was used as needle punched non-woven fabric 20.

Embodiment 2

The structure shown in FIG. 10.

Embodiment 3

The structure shown in FIG. 11.

Embodiment 4

The structure shown in FIG. 13.

Embodiment 5

The structure shown in FIG. 14.

Embodiment 6

The structure shown in FIG. 15.

Embodiment 7

The structure shown in FIG. 16.

Embodiment 8

The structure shown in FIG. 17.

Properties of the Examples 1 to 7 for comparison and of Embodiments 2 to 8 were compared, and the results were as shown in Table 1.

TABLE 1

Comparison of Properties Between Embodiments 2~8 and Examples 1~7

|  | Cushioning Property | Uniformity of Pressure in Planar Direction | Uniformity of Thermal Conductivity in Planar Direction | Dimensional Stability with Time | Life | Releasing Property | Exudation of Compounding Agent |
|---|---|---|---|---|---|---|---|
| Example 1 for Comparison | ◉ | ◉ | ◉ | XX | XX | Δ | not observed |
| Example 2 for Comparison FIG. 2 | X | X | X | ○ | ○ | XX | observed |
| Example 3 for Comparison FIG. 3 | Δ | Δ | Δ | Δ | ○ | Δ | not observed |
| Example 4 for Comparison FIG. 4 | Δ | Δ | Δ | ○ | ○ | Δ | not observed |
| Example 5 for Comparison FIG. 5 | Δ | Δ | Δ | ○ | ○ | Δ | not observed |
| Example 6 for Comparison FIG. 6 | X | ○ | ○ | ○ | Δ | Δ | not observed |
| Example 7 for Comparison FIG. 7 | ○ | ○ | ○ | X | X | XX | observed |
| Embodiment 2 FIG. 10 | ○ | ○ | ○ | ○ | ○ | ◉ | not observed |
| Embodiment 3 FIG. 11 | ◉ | ◉ | ◉ | ○ | ○ | ◉ | not observed |
| Embodiment 4 FIG. 13 | ○ | ◉ | ◉ | ◉ | ◉ | ◉ | not observed |
| Embodiment 5 FIG. 14 | Δ | ◉ | ◉ | ○ | ○ | ◉ | not observed |
| Embodiment 6 FIG. 15 | ○ | ◉ | ◉ | ◉ | ◉ | ◉ | not observed |

TABLE 1-continued

Comparison of Properties Between Embodiments 2~8 and Examples 1~7

|  | Cushioning Property | Uniformity of Pressure in Planar Direction | Uniformity of Thermal Conductivity in Planar Direction | Dimensional Stability with Time | Life | Releasing Property | Exudation of Compounding Agent |
|---|---|---|---|---|---|---|---|
| Embodiment 7 FIG. 16 | ◉ | ◉ | ◉ | Δ | Δ | ◉ | not observed |
| Embodiment 8 FIG. 17 | ◉ | ○ | ◉ | ◉ | ◉ | ○ | not observed |

Evaluation
◉ . . . Excellent
○ . . . Good
Δ . . . Average
X . . . Below Average
XX . . . Far Below Average

What is claimed is:

1. A cushioning pad used for manufacturing a laminate by a hot press and interposed between the entire surface of the laminate and a heating platen in order to apply uniform pressure and heat to the entire surface of the laminate to be pressed, comprising:

(a) two or more fiber material layers, said layers comprising non-woven fabric, a woven fabric, or paper;

(b) a bonding material layer positioned between each of the fiber material layers for bonding upper and lower fiber material layers;

(c) an upper rubber layer positioned on an upper surface of the uppermost of said fiber material layers, and (d) a lower rubber layer positioned on a lower surface of the lowermost of said fiber material layers, said upper and lower rubber layers being so constituted that weight loss of ten percent (10%) by thermal decomposition occurs at a temperature of at least 380° C., and (e) an upper releasing layer positioned on an upper surface of the upper rubber layer for preventing exudation of a compounding agent contained in the upper rubber layer, said layers being adhered without any adhesive agent layer; and (f) a lower releasing layer positioned on a lower surface of the lower rubber layer for preventing exudation of a compounding agent contained in the lower rubber layer, said layers being adhered without any adhesive agent layer, said releasing layers (e) and (f) being selected from the group consisting of synthetic resin film, metal film, woven fabric, and paper.

2. The cushioning pad according to claim 1, wherein all the fiber material layers are formed of a same material.

3. The cushioning pad according to claim 1, wherein one, two or more said fiber material layers are formed of a material different from a material of remaining said fiber material layer.

4. The cushioning pad according to claim 1, wherein the bonding material layer has an adhesive agent.

5. The cushioning pad according to claim 1, wherein the bonding material layer comprises (i) a base material sheet resistant to deformation in a planar direction when subjected to heat or pressure, and (ii) an adhesive agent applied to opposing surfaces of the base material sheet.

6. The cushioning pad according to claim 1, wherein the bonding material layer is a rubber sheet.

7. The cushioning pad according to claim 6, wherein the bonding material layer is a rubber sheet in which a reinforcing woven fabric is embedded.

8. The cushioning pad according to claim 1, wherein said fiber material is a non-woven fabric,
the bonding material layer is a foundation fabric with meshes, and
said non-woven fabric and said foundation fabric are bonded by tangling between fibers and the meshes of the foundation fabric caused by needle punching.

9. The cushioning pad according to claim 8, wherein an adhesive agent is applied to the foundation fabric, and
said non-woven fabric and said foundation fabric are bonded by tangling between fibers and the meshes of the foundation fabric caused by needle punching as well as by adhesion by the adhesive agent.

10. The cushioning pad according to claim 1, wherein the bonding material layer includes a first bonding material layer and a second bonding material layer;
the fiber material layer is a non-woven fabric;
the first bonding material layer is a foundation fabric with meshes;
said non-woven fabric and said foundation fabric are bonded by tangling between fibers and the meshes of the foundation fabric caused by needle punching;
the second bonding material layer has an adhesive agent; and
said cushioning material being prepared by laminating by means of the second bonding material layer, multiple stages of bonded non-woven fabric layers each prepared by bonding two or more said non-woven fabric layers by said first bonding material layer.

11. The cushioning pad according to claim 10, wherein the second bonding material layer has a base material having a deformation in a planar direction when subjected to heat or pressure, and an adhesive agent applied to opposing surfaces of the base material sheet.

12. The cushioning pad according to claim 10, wherein an adhesive agent is applied to the foundation fabric of the first bonding material layer; and
said non-woven fabric and said foundation fabric are bonded by tangling between fibers and the foundation fabric caused by needle punching as well as by adhesion by the adhesive agent.

13. The cushioning pad according to claim 4, wherein said adhesive agent is a fluoroelastomer adhesive agent.

14. The cushioning pad according to claim 4, wherein said adhesive agent is an EPDM adhesive agent.

15. The cushioning pad according to claim 1, wherein the fiber material layer includes a fiber of which glass transition temperature is at least 200° C. and of which temperature at which weight loss of 10% is caused by thermal decomposition is at least 400° C.

16. The cushioning pad according to claim 1, wherein an acrylic monomer is added to a composition forming the upper and the lower rubber layers.

17. The cushioning pad according to claim 1, wherein a main component of the upper and lower rubber layers is a fluoroelastomer.

18. The cushioning pad according to claim 1, wherein a main component of the upper and lower rubber layers is an EPDM.

19. The cushioning pad according to claim 1, wherein the upper and the lower rubber layers are rubber coatings applied to rear surfaces of the releasing layers.

20. The cushioning pad according to claim 1, wherein the exudation preventing layer is prepared by applying a resin selected from the group consisting of polyimide resin, fluoride resin, melamine resin and acryl resin, to a surface of a base material selected from the group consisting of a woven fabric and paper.

21. The cushioning pad according to claim 1, wherein the exudation preventing layer is a fluoride resin film.

* * * * *